United States Patent [19]

Rickborn et al.

[11] Patent Number: 4,818,607
[45] Date of Patent: Apr. 4, 1989

[54] SMALL HOLLOW PARTICLES WITH CONDUCTIVE COATING

[75] Inventors: Steven F. Rickborn, San Jose; Donald Z. Rogers, Menlo Park, both of Calif.

[73] Assignee: Northrop Corporation, Hawthorne, Calif.

[21] Appl. No.: 48,531

[22] Filed: May 8, 1987

Related U.S. Application Data

[63] Continuation of Ser. No. 761,747, Aug. 1, 1985, abandoned, which is a continuation-in-part of Ser. No. 672,407, Nov. 16, 1984, abandoned, and Ser. No. 672,396, Nov. 16, 1984, abandoned.

[51] Int. Cl.$^4$ .................. B32B 5/16; C04B 35/52
[52] U.S. Cl. ........................... 428/323; 427/249; 428/331; 428/403; 428/404; 428/406; 501/90
[58] Field of Search ............... 428/331, 325, 323, 332, 428/406, 403, 404, 408, 392, 366, 368, 245, 902; 427/249; 106/288 B; 501/90; 252/502

[56] References Cited

U.S. PATENT DOCUMENTS

| | | | |
|---|---|---|---|
| 3,428,519 | 2/1969 | Zvanyt | 428/392 |
| 3,565,683 | 2/1971 | Morelock | 428/366 |
| 3,676,293 | 7/1972 | Gruber | 428/368 |
| 3,969,124 | 7/1976 | Stewart | 427/249 X |
| 3,991,248 | 11/1976 | Bauer | 428/245 |
| 4,011,096 | 3/1977 | Sandell | 106/288 B |
| 4,321,154 | 3/1982 | Ledru | 428/902 X |
| 4,381,334 | 4/1983 | Balk et al. | 428/332 |
| 4,510,077 | 4/1985 | Elton | 252/502 |
| 4,574,109 | 3/1986 | Laroche | 428/325 |
| 4,582,756 | 4/1986 | Niinuma et al. | 428/403 X |

*Primary Examiner*—Thomas J. Herbert
*Attorney, Agent, or Firm*—Terry J. Anderson; Robert B. Block

[57] ABSTRACT

The present invention provides an electrically conductive material (10) comprising a substantially spherical refractory particle (12) having an exterior surface (14) and having a diameter of no more than about 5 millimeters. An electrically conducting coating (22) substantially equally covers the entire exterior surface (14), the coating (22) having at least about 70 atomic percent carbon and being from about 10 Angstroms to about 500 Angstroms thick. A plurality of such particles (12) are useful as filler materials. Also, such particles (12) are useful as flowing electrodes. Objects containing the particles (12) have desirable electrical properties.

14 Claims, 2 Drawing Sheets

SMALL HOLLOW PARTICLES WITH CONDUCTIVE COATING

This application is a continuation of Ser. No. 761,747 filed Aug. 1, 1985, now abandoned, which is a continuation-in-part of applications Ser. Nos. 672,407 and 672,396, both filed Nov. 16, 1984, and both now abandoned.

TECHNICAL FIELD

The invention relates to small hollow refractory generally spherical particles having external surfaces which are substantially equally covered with an electrically conducting coating. The particles may be used as filler materials to provide articles of controlled electrical properties and density, or, as flowing electrodes.

BACKGROUND ART

The production of coated refractory fibers is known as taught, for example, in U.S. Pat. No. 3,428,519, issued Feb. 18, 1969 to Carl M. Zavanut and in U.S. Pat. No. 3,565,683, issued Feb. 23, 1971 to Charles R. Morelock. U.S. Pat. No. 3,676,293, issued July 11, 1972 to Bernard A. Gruber also discloses coated fibers. U.S. Pat. No. 3,969,124, issued July 13, 1976 to Wilford S. Stewart, discloses carbonaceous material which may be reinforced with fibers and whiskers. U.S. Pat. No. 4,321,154, issued Mar. 23, 1982 to Francois LeDru discloses fibers in a matrix which is partially pyrolytic carbon. U.S. Pat. No. 4,407,969 discloses a flexible thermally insulative refractory composition which may contain inorganic fibers. U.S. Pat. No. 3,281,261 discloses carbonization of alumina coated fabric.

U.S. Pat. No. 3,462,340, issued Aug. 19, 1969 to Ralph L. Hough discloses fibers in a pyrolytic matrix. U.S. Pat. No. 3,853,610, issued Dec. 10, 1974 to Joseph B. Byrne, et al, discloses long carbon fibers coated with amorphous carbon and dispersed in a resin matrix. U.S. Pat. No. 3,991,248, issued Nov. 9, 1976 to Dieter W. Bauer discloses carbon coated on long fibers with graphite deposited in the pores of a fiber reinforced product. U.S. Pat. No. 4,152,482, issued May 1, 1979 to Carl B. Reynolds, et al, discloses uncoated fibers in a carbon matrix. U.S. Pat. No. 4,178,413, issued Dec. 11, 1979 to Gabriel P. DeMunda discloses uncoated long fibers. U.S. Pat. No. 4,391,873, issued July 5, 1983 to Gilbert W. Brassell, et al discloses uncoated fibers. U.S. Pat. No. 3,407,038, issued Oct. 22, 1968 to William C. Beasley discloses uncoated graphite fibers. U.S. Pat. No. 3,462,289, issued Aug. 19, 1969 to Cornelius W. Rohl, et al discloses uncoated fibers.

Carbon coated nuclear fuel particles have been formulated which have certain advantages over uncoated nuclear fuel particles as is discussed in the book "Vapor Deposition" by Powell, Oxley and Blocher, Wiley & Sons, 1966.

The coating of hollow microsphere with metal is also known as reported, for example, in Proceeding of the Conference On Chemical Vapor Deposition, Fifth International Conference, Edited by J. M. Blocher, H. E. Hintermann and L. H. Idall, The Electrochemical Society, Princeton, N.J., 1975, in an article entitled "Microspherical Laser Targets by CVD" by William J. McCreary, pp 714–725.

The prior art does not teach or suggest very small generally spherical hollow particles, having a greatest dimension of no more than 5 millimeters and having an electrically conductive coating substantially equally covering the exterior surface of the coating, which coating must have at least about 70 atomic percent carbon and must be from about 10 Angstroms to about 500 Angstroms in thickness or such advantageous products as can be made from such particles including matrices having such particles dispersed therethroughout or the use of a plurality of such particles as flowing electrodes.

DISCLOSURE OF INVENTION

The present invention is directed to solving one or more of the problems as set forth above.

In accordance with the present invention an electrically conducting material is provided. The electrically conducting material comprises a hollow refractory generally spherical particle having an exterior surface and having a greatest dimension of no more than about 5 millimeters. The exterior surface is covered with an electrically conductive coating which substantially equally covers that surface. The coating has at least about 70 atomic percent carbon and is from about 10 Angstroms to about 500 Angstroms thick.

Coated particles in accordance with the present invention have a number of advantages over the various coated particles of the prior art. First, since the particles are both very small and regular and coated substantially equally over their entire exterior surfaces, they have particularly good conductive properties. Thus, if they are incorporated in a resin or other matrix they impart particularly good electrical properties to the matrix. Also, because the particles are generally substantially spherical in shape, a plurality of the particles can be used as a flowing electrode. The fact that the coating substantially equally covers the entire exterior surface is important to this use since good conductivity is assured from one coated particle to the next.

BRIEF DESCRIPTION OF DRAWING

The invention will be better understood by reference to the figures of the drawing wherein like numbers denote like parts throughout and wherein.

BEST MODE FOR CARRYING OUT INVENTION

Figure 1:
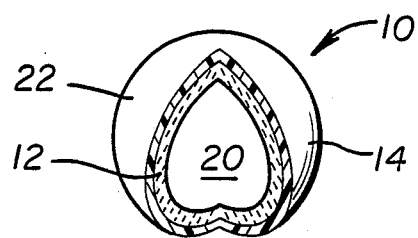
FIG. 1 is a view, partially cut away, showing a hollow spherical particle in accordance with the present invention.
Figure 2:
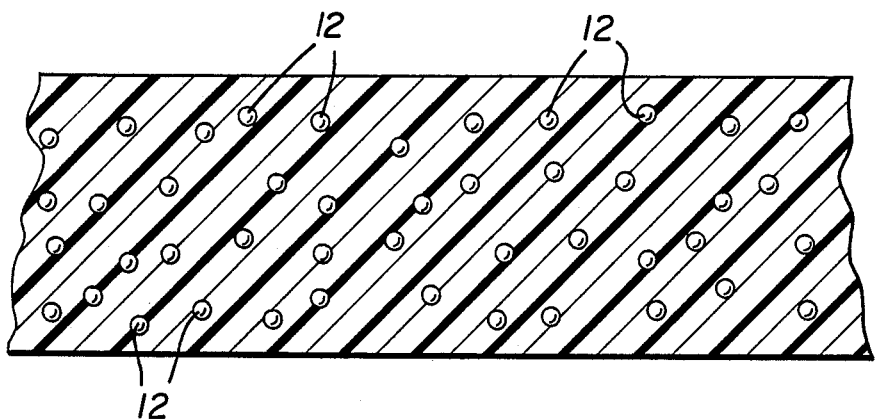
FIG. 2 illustrates a composite material incorporating a plurality of particles in accordance with the present invention.
Figure 4:
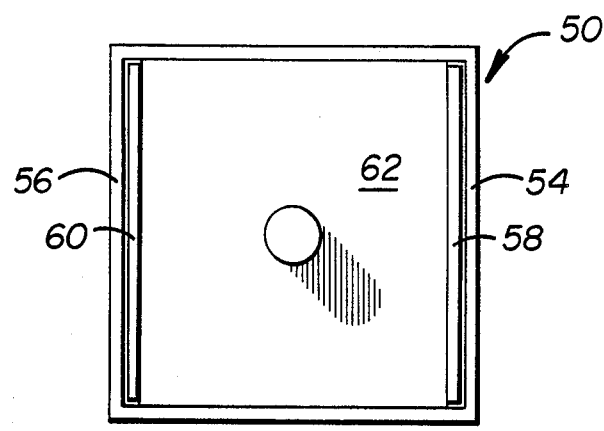
FIG. 4 illustrates the device of FIG. 3 in top view.

In accordance with the present invention an electrically conductive material 10 is set forth in the nature of a substantially spherical refractory particle 12 having an exterior surface 14 having a diameter of no more than about 5 millimeters and more preferably no more than about 1 millimeter. Generally, such refractory particles 12 will be present in large number. The spheres 12 are hollow, having a central void 20 whereby they are light in weight yet have good structural integrity. The particles 12 are generally formed of a glass, ceramic or other refractory material.

An electrically conductive coating 22 is present which substantially equally covers substantially the entire exterior surface 14 of the particles 12. The coating 22 is generally from about 10 Angstroms to about 500 Angstroms in thickness. Also, the coating 22 must have at least about 70 atomic percent carbon. Preferably, the coating contains at least about 80 atomic percent carbon.

Figure 3:
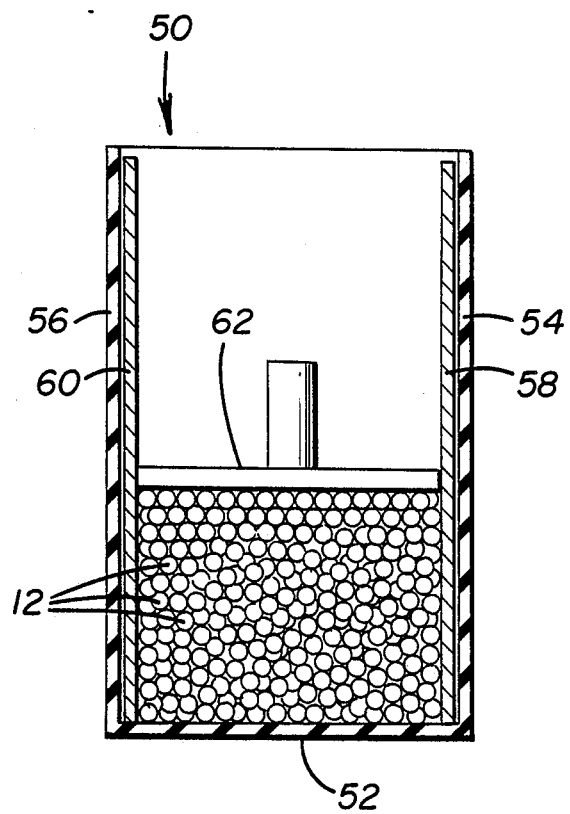
FIG. 3 illustrates, in side sectional view, a device for measuring the bulk resistance of coated particles.

In accordance with the present invention, the conductive coating 22 encapsulates the particle 12 substantially equally over its entire exterior surface 14. FIG. 1 shows the extent of coverage attainable of the particles 12 in accordance with the methods of formation of such particles 12 as set forth hereinbelow. As will be apparent, substantially each particle 12 is substantially completely coated with the coating 22. The coating 22 is applied in a sufficient quantity to render the particles 12 electrically conducting with a bulk resistance of the desired value. In the preferred mode of the invention, the bulk resistance, is between 1 ohm and 500K ohms. The bulk resistance of the coated particles 12 is measured by the following procedure. Twenty milliliters of the coated particles are placed in an insulating chamber 50 (FIG. 3) with an insulating base 52 measuring 1"×1", and with two of the opposite interior sides 54, 56 completely covered with nickel plates 58, 60. The sample is settled by gentle vibration and then compressed by a cover 62 weighing 22.2 grams that completely covers the top surface of the particles 12 in the chamber 50. The system is then allowed to stabilize for ten minutes. The bulk resistance of the coated particles is equal to the resistance between the nickel plates 58, 60. Basically the coating 22 is a pyrolyzed carbon coating.

The conductive coating 22 which encapsulates the particles 12 must comprise no more than about 10 weight percent of the particles 12, preferably no more than about 5 weight percent of the particles 12 and still more preferably no more than about 2 weight percent of the particles 12. The coating preferably comprises at least about 0.001 weight percent of the particles 12.

In accordance with the invention, the coating 22 is preferably formed on the particles 12 by contacting a carbon-containing precursor with substantially the entire surfaces of the particles 12, the particles 12 being of a temperature which lies between about 700° C. and about 1200° C. during such contacting.

In accordance with one specific method, an intimate mixture is made of a carbon-containing precursor and a large number of particles 12 which are to be coated. The intimate mixture is placed under vacuum conditions and the temperature of the mixture is brought to be between about 700° C. and about 1200° C. These conditions are maintained until the particles 12 are covered with a pyrolyzed electrically conductive coating 22 formed from the precursor in a thickness of from between about 10 Angstroms and 500 Angstroms.

In accordance with another method, an intimate mixture of a carbon-containing precursor and a large number of the particles 12 to be coated are placed under an inert atmosphere and the temperature of the mixture is brought to a temperature between 700° C. and 1200° C. The conditions are maintained until the particles 12 are covered with a pyrolyzed coating formed from the precursor in a thickness of from about 10 Angstroms to about 500 Angstroms.

The coating 22 which is formed in any of the above cases is substantially uniform and electrically conductive and contains at least about 70 atomic percent carbon.

The refractory material of the hollow particles 12 may be of the nature of glass or a ceramic material having the illustrated voids 20 therein. Such spheres are readily available commercially and sold, for example, under the trademark "ECCOSPHERES" by the Emerson and Cuming division of W. R. Grace and Co. Such spheres are conventionally used, for example, in syntactic foam materials for buoyancy applications. They are free flowing thin-walled hollow glass and ceramic spheres approximately 10 to 300 microns in diameter. They have a true particle density of approximately one-tenth that of other commonly used inorganic fillers. Wall thickness is about 1.5 microns. Bulk density is about 0.15 gram per cc. Such spheres are describes in Technical Bulletin 14-2-2 published by Emerson and Cuming as revised in April 1978. Generally, they are made of silicon dioxide.

Prior to coating the particles 12 it is advisable to thoroughly outgas them and dehydrate them. This can be accomplished, for example, by placing them in the system in which they are to be coated with the conductive coating 22 and slowly raising the temperature, for example by 75° C. increments, to a temperature of about 300° C. and then leaving the uncoated particles 12 at this temperature for, for example, 15 hours. Thereafter the temperature is increased to the coating temperature. Alternatively, the particles can first be degassed and then cooled down, mixed with the precursor and placed in the system for carrying out of any of the various methods mentioned above.

The nature of the precursor is relatively unimportant to the properties of the final coated particles 12. Indeed, substantially any precursor material which is organic in nature can be utilized to provide the needed conductive coating 22. Generally, it is preferred that the precursor be of sufficiently low volatility so that the vapor will have a significant residence time in the reactor at a temperature between about 700° C. and about 1200° C. It is important to realize that the chemical structure of the precursor material is of virtually no importance since it is decomposed in forming the desired coating 22. Therefore, any of a broad range of organic precursors may be used.

The coated particles 12 can be utilized as filler materials thereby providing conductive properties to articles of manufacture. For example, the particles 12 can be incorporated in resins as fillers therein. The particles 12 greatly reduce the density of the resulting product. Also, they are useful as flowing electrodes.

The invention will be better understood by reference to the following illustrative examples which demonstrate the methods of synthesis mentioned above and some of the properties and/or uses of the particles.

EXAMPLE 1

Free flowing hollow fused silica spheres (Eccospheres ®) (8.92 gram) were mixed with 1.79 gram zinc phthalocyanine. The mixture was placed in a quartz tube which was evacuated to 0.007 Torr. The temperature of the mixture was raised to 300° C. over 4.5 hours, and then held at 300° C. for 15 hours. The temperature was then raised to 900° C. over 5 hours, and kept at 900° C. for 2 hours. During this time the pressure rose to 0.20 Torr. The system was then cooled while maintaining vacuum. The product was removed from the quartz tube, and passed through a 70 mesh screen to remove agglomerated material. The material that passed through the 70 mesh screen was collected to give 7.2 grams of coated spheres. The bulk resistance of the coated particles was measured by the method described herein and was found to be 487 ohms. The composition of the film was: C—84.34%, H—0.72%, N—13.99%, Zn—0.94%. The film comprised 1.38 weight percent of the total weight of the coated particles as calculated from the elemental anaylsis. Examination of the coated particles under an optical microscope showed each particle to be totally encapsulated with an even coating of the film. This example demonstrates particle coating in a vacuum.

EXAMPLE 2

Hollow fused silica spheres (Eccospheres ®) (7.76 gram) were mixed with 0.155 gram zinc phthalocyanine and placed in a quartz reactor. The reactor was purged three times by evacuation and backfilling with nitrogen. The open end of the reactor was then connected to a nitrogen source and a bubbler so that a slight positive pressure of nitrogen was maintained in the reactor, while preventing any pressure buildup. The reactor was then heated to 800° C. over 21 minutes, held at 800° C. for 30 minutes, and allowed to cool. This provided 7.34 gram of coated hollow spheres. Examination under an optical microscope showed each particle to be individually and completely encapsulated with a thin carbon film. The bulk resistance of the coated particles was 385 ohm. The composition of the film was: C—77.20%, H—1.77%, N—15.94%, Zn—5.3%. The film comprised 0.79 weight percent of the total weight of the coated particles. This example demonstrates particle coating in an inert atmosphere at ambient pressure.

EXAMPLE 3

Hollow fused silica spheres (Eccospheres ®) (7.89 gram) were mixed with 0.16 gram hydrogen phthalocyanine and placed in a quartz reactor. The reactor was purged and placed under a nitrogen atmosphere as in Example 2. The reactor was heated to 850° C. over 20 minutes, and then allowed to cool. The coated particles were passed through a 70 mesh screen to give 7.08 gram coated particles, with a bulk resistance of 4.26 Kohm. The composition of the film was: C—79.58%, H—7.75%, N—12.67%. The film comprised 0.142 weight percent of the total weight of the coated particles. This example demonstrates that precursors other than zinc phthalocyanine may be used, and that the observed conductivity of the coated particles are not due to any metal content of the film.

EXAMPLE 4

Hollow aluminum oxide microspheres (Emerson & Cuming Eccospheres ®FAB) (20.6 grams) were mixed with 0.20 gram zinc phthalocyanine and placed in a quartz reactor. The reactor was purged and placed under a nitrogen atmosphere as in Example 2. The reactor was heated to 900° C. over 30 minutes, then left at 900° C. for an additional 30 minutes, then allowed to cool under a nitrogen atmosphere. The resulting coated particles were passed through a seventy mesh screen to give 17.6 gram coated particles, with a bulk resistance of 1.05 Kohm. The composition of the film was: C—88.80%, H—1.06%, N—7.18%, Zn—2.96%. The film comprised 0.4771% of the total weight of the coated particles. This example demonstrates that ceramic particles composed of materials other than silicon dioxide may be used.

EXAMPLE 5

Hollow fused silica spheres (Eccospheres ®) (7.92 gram) were mixed with powdered polyacrylonitrile (0.40 gram) and placed in a quartz reactor. The reactor was purged and placed under a nitrogen atmospheres as in Example 2. The reactor was heated to 800° C. over 28 minutes, kept at 800° C. for 30 minutes, and then allowed to cool. The coated particles were passed through a 70 mesh screen to give 6.31 gram coated particles, with a bulk resistance of 21 Kohm. The composition of the film was: C—77.42%, H—1.90%, N—20.68%. The film comprised 1.581 weight percent of the total weight of the coated particles. This example demonstrates that precursors other than phthalocyanines may be used.

EXAMPLE 6

Aluminum oxide particles (140 to 325 mesh) were dehydrated by heating to 800° C. in vacuum. The particles were solid, with an irregular shape and a high surface area. The dehydrated aluminum oxide (52.09 gram) was mixed with zinc phthalocyanine (1.04 gram) and placed in a quartz reactor. The reactor was purged and placed under a nitrogen atmosphere as in Example 2. The reactor was heated to 800° C. over 46 minutes, kept at 800° C. for 30 minutes, and then allowed to cool. The coated particles weighed in total 51.76 gram, and were seen to be entirely coated by examination under an optical microscope. The coated particles were black in appearance. The bulk resistance of the coated particles was greater than 20 Mohm. The carbon in the film comprised 0.975% of the total weight of the coated particles. Accurate film compositions could not be obtained because of reabsorption of water by the alumina particles.

This example demonstrates that the shape and surface area of the particle strongly effect the bulk resistance of the coated particles.

INDUSTRIAL APPLICABILITY

Particles 12 made in accordance with the present invention are useful as filler materials. They are also useful as flowing electrodes. The resultant products have desired conducting properties.

While the invention has been described in connection with certain specific embodiments thereof it will be realized by those skilled in the art that the invention has further uses and objects and that the invention herein covers such other uses and objects and is as set forth in the appended claims.

We claim:

1. An electrically conducting material, comprising:
   a small hollow refractory generally spherical particle having an exterior surface; and
   an electrically conducting coating substantially equally covering said exterior surface, said coating having at least about 70 atomic percent carbon and being from about 10 Angstroms to about 500 Angstroms thick.

2. A material as set forth in claim 1, wherein there are a plurality of such coated particles.

3. A material as set forth in claim 2, wherein said coated particles are embedded in a matrix.

4. A material as set forth in claim 1, wherein said particle has a greatest dimension of no more than about 5 millimeters.

5. A material as set forth in claim 1, wherein said exterior surface is substantially completely encapsulated within said coating.

6. A material as set forth in claim 1, wherein a plurality of said refractory particles have, in bulk, a resistance of between about 500 Kohm and about 1 ohm.

7. A material as set forth in claim 1, wherein said coating comprises no more than about 10 weight percent of said particle.

8. A material as set forth in claim 1, wherein said coating comprises from about 0.001 to about 12 weight percent of said particle.

9. A material as set forth in claim 1, wherein said coating is formed by contacting a carbon-containing precursor with substantially said entire exterior surface, said particles being at a temperature which lies between about 700° C. and about 1200° C. during such contacting.

10. An electrode comprising a plurality of small hollow substantially spherical refractory particles each having an exterior surface; and
an electrically conducting coating substantially equally covering said exterior surface, said coating having at least about 70 atomic percent carbon and being from about 10 Angstroms to about 500 Angstroms thick.

11. An electrode as set forth in claim 10 wherein said particles each have a diameter of no more than about 5 millimeters.

12. An electrode as set forth in claim 11, wherein said exterior surface is substantially completely encapsulated within said coating.

13. A material as set forth in claim 12, wherein said coating comprises from about 0.001 to about 12 weight percent of said particle.

14. A material as set forth in claim 13, wherein said particles have, in bulk, a resistance of between about 500 K ohm and about 1 ohm.

* * * * *